(12) United States Patent
Duoss et al.

(10) Patent No.: US 11,360,348 B2
(45) Date of Patent: Jun. 14, 2022

(54) SYSTEM AND METHOD FOR LIQUID CRYSTAL DISPLAY SYSTEM INCORPORATING WIRE GRID POLARIZERS FOR LARGE SCALE AND LARGE VOLUME STEREOLITHOGRAPHY

(71) Applicants: Lawrence Livermore National Security, LLC, Livermore, CA (US); Board of Regents, The University of Texas System, Austin, TX (US)

(72) Inventors: Eric B. Duoss, Danville, CA (US); James Oakdale, Castro Valley, CA (US); Nicholas Anthony Rodriguez, Austin, TX (US); Hongtao Song, Austin, TX (US); Richard Crawford, Austin, TX (US); Carolyn Seepersad, Austin, TX (US); Morgan Chen, Richardson, TX (US)

(73) Assignees: Lawrence Livermore National Security, LLC, Livermore, CA (US); Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 17/085,244

(22) Filed: Oct. 30, 2020

(65) Prior Publication Data
US 2022/0137452 A1 May 5, 2022

(51) Int. Cl.
*G02F 1/1335* (2006.01)
*G02F 1/13357* (2006.01)
(Continued)

(52) U.S. Cl.
CPC ...... *G02F 1/133528* (2013.01); *B29C 64/286* (2017.08); *B33Y 30/00* (2014.12); *G02F 1/133512* (2013.01); *G02F 1/133603* (2013.01); *G03F 7/20* (2013.01); *G02F 1/133531* (2021.01); *G02F 1/133548* (2021.01); *G02F 2202/36* (2013.01)

(58) Field of Classification Search
None
See application file for complete search history.

(56) References Cited

U.S. PATENT DOCUMENTS

2006/0147845 A1* 7/2006 Flanigan ............. G03F 7/70291
430/322
2013/0201557 A1* 8/2013 Davis ................... G02B 5/3058
359/486.01

(Continued)

*Primary Examiner* — Phu Vu
(74) *Attorney, Agent, or Firm* — Harness, Dickey & Pierce, P.L.C.

(57) ABSTRACT

The present disclosure relates to a liquid crystal display (LCD) system. The system in one example has a light source for generating unpolarized light, and an LCD screen arranged in a path of transmittance of the unpolarized light. First and second wire grid polarizers are arranged adjacent to the LCD screen and each have a plurality of nano-scale wires, with the first and second wire grid polarizers have differing polarizations. A pitch of each of the nano-scale wires is no larger than one-third a wavelength of the unpolarized light from the light source. The wire grid polarizers create, in connection with operation of the LCD screen, a 2D light mask suitable for initiating the polymerization of an optically curable material.

20 Claims, 7 Drawing Sheets

(51) Int. Cl.
*B33Y 30/00* (2015.01)
*G03F 7/20* (2006.01)
*B29C 64/286* (2017.01)

(56) References Cited

U.S. PATENT DOCUMENTS

2018/0059301 A1* 3/2018 An .................... G02F 1/133512
2019/0094626 A1* 3/2019 Yanai .................. G02B 5/3008

* cited by examiner

65cm x 40cm build area requires approximately 1.04 kW@405nm on printing surface
Largest DMD is limited to 26.6W from 400nm - 420nm; would need visible light

- Light must be patterned without a size limited digital dynamic mask
- Solution = Monochrome LCD backlit by UV LED array 30", 10MP Monochrome LCD with 158$\mu$m pixels

| Wavelength (nm) | Film Polarizer | | Wire Grid Polarizer | |
|---|---|---|---|---|
| | Single | Parallel | Single | Parallel |
| 365 | 0 | 0 | 32% | 18% |
| 385 | 0 | 0 | 38% | 25% |
| 405 | 27% | 15% | 42% | 32% |
| 450 | 38% | 29% | 45% | 36% |

Wire Grid Polarizer

• Survived 2000 mW/cm$^2$ intensity for 180s

• No visual damage, transmission rate unaffected

• Max Temperature at ~210 C.

5s, 80° C  　　　　　　　　105s, 95° C

Measured and Calculated Transmission Through LCD and WGP

| Wavelength (nm) | Monochrome LCD | Parallel Wire Grid Polarizers | Expected Transmission* |
|---|---|---|---|
| 365 | 26.3% | 18.4% | 4.8% |
| 385 | 30% | 25.2% | 7.6% |
| 405 | 33.0% | 31.6% | 10.4% |
| 450 | 36.8% | 35.5% | 13.1% |

*(Transmission Through LCD)*(Transmission Through Polarizer)/100

FIGURE 8

Curing results and necessary light source for 7-10s cure time

| Intensity (mW/cm$^2$) | Gel Time (s) | Necessary Light Source (mW/cm$^2$) |
|---|---|---|
| 93 | 7.5 | 1922 |
| 97 | 7.5 | 1283 |
| 245 | 10 | 2397 |
| 245 | > 120 | N/A |

**(Intensity at resin)/(Transmission rate through system)

FIGURE 9

SYSTEM AND METHOD FOR LIQUID CRYSTAL DISPLAY SYSTEM INCORPORATING WIRE GRID POLARIZERS FOR LARGE SCALE AND LARGE VOLUME STEREOLITHOGRAPHY

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates to liquid crystal display (LCD) modules, and more particularly to a LCD system that incorporates wire grid polarizers for creating patterned two-dimensional light for use in stereolithography.

BACKGROUND

The statements in this section merely provide background information related to the present disclosure and may not constitute prior art.

Traditional stereolithography uses a galvo-mirror to scan a UV laser beam across the surface of a vat of resin, curing any photopolymer that receives sufficient exposure to initiate polymerization. This technique allows for scaling up, and existing commercial machines can print parts at least as large as 1500 mm×750 mm×550 mm, since the main limiting factors for increasing build size are material handling difficulties and distortion of the laser beam at high angles. However, since the laser scanning process is serial, the build time rapidly increases with larger build volumes, and print time is heavily dependent on the complexity of the part geometry.

In addition to the foregoing limitation, laser-based stereolithography typically has the light source placed above the vat with the laser scanning down to the surface of the resin. The light from the laser polymerizes a layer of uncured resin in between the surface of the vat and a previously cured layer. This configuration is suitable for resins with low viscosities that are able to spread smoothly and self-level due to gravity in order to achieve thin layers of 50-100 µm. However, high-viscosity resins, such as elastomers with high molecular weights, cannot be recoated in this fashion. As such, high molecular weight resins must either be constrained with a membrane or printed in an inverted fashion where the light source comes from below the resin vat. This printing in an inverted fashion is also known as printing in a "bottom-up" manner.

Many stereolithography devices that print in a bottom-up manner use spatial light modulators, such as a digital micro-mirror device (DMD) or liquid crystal on silicon (LCoS), to project light over the entire build area of resin at once, rather than scanning a single point across the surface. Both of these technologies take a uniform field of light, pattern it, and reflect an image which can then be magnified or de-magnified to achieve the desired area and feature size. A DMD contains an array of millions of micromirrors that each reflect the light either into a beam dump or the desired beam path, depending on the state of the pixel. An LCoS similarly patterns the light through turning each pixel on or off, but it uses a reflective liquid crystal display to pattern the light. These dynamic masks are able to print more quickly than traditional stereolithography, as print time is not dependent on either part complexity or its footprint, and a single layer only takes as much time as the resin needs to initiate crosslinking.

However, digital masks as described above are not able to be scaled up in size easily. The chips used to form these types of digital masks themselves have a maximum size of around 1" diagonal, and larger images can only be achieved in two ways: magnifying the image or scanning the image across a larger area. Magnifying the image has limitations due to the fixed relationship between the chip size and pixel size; a larger image must also have a larger minimum feature size. DMD and LCoS chips are also limited in the maximum intensity of light that can be patterned. For example, the DLP9500 DMD available from Texas Instruments, Inc., can pattern near-UV light with a maximum intensity of 11 $W/cm^2$, or 26 W of total power based on its active pixel area of 20.7×11.7 $mm^2$, and this specification drops off rapidly with decreasing wavelengths. This total power can create high enough intensities for crosslinking over small areas, but these sufficient intensities cannot be achieved when the light is spread out over an area of more than a few square inches, limiting maximum part size. FIG. 1 shows a calculation based on the expected intensities needed to induce polymerization and the difficulty in achieving those intensities over a large area using a DMD.

Another solution, if using a DMD, is to scan the dynamically patterned image over the surface of the resin, changing the image as it scans across each row. This Large Area Projection Micro-Stereolithography technique has allowed larger parts to be fabricated using spatial light modulators but starts to suffer from the same disadvantages as traditional laser-based stereolithography, since it requires longer layer fabrication times that are dependent on the part's footprint and could have distorted features as the image is scanned across more extreme distances.

A third vat polymerization technique uses an LCD screen with a near-UV backlight to produce a patterned image on the resin surface. This light patterning source also typically comes from below the resin bath and can use either a color or monochrome LCD screen. Color LCDs contain a color filter, which consists of three sub-pixels, each passing only red, green, or blue light. As only the blue color filter will transmit any light near the ultraviolet spectrum, these screens are limited in their usefulness for curing most photopolymers and are often used with "daylight resins" that are reactive at higher wavelengths around 450 nm. Monochrome LCDs, as opposed to color LCDs, do not have color filters and are much more efficient at patterning lower wavelength light and can therefore be used with a 405 nm light source. This has been confirmed by the co-inventors of the present disclosure through conducted transmittance tests using both a color and monochrome LCD screen at four different wavelengths of 365 nm, 385 nm, 405 nm, and 450 nm. The color screen did not transmit any light below 405 nm, and even its performance using visible light at 405 and 450 nm was three to four times worse than the monochrome LCD.

The other main components in an LCD screen that limit how much light is transmitted are the two film polarizers on either side of the liquid crystal. These polarizers are made of stretched sheets of polyvinyl alcohol (PVA) and are absorptive polarizers; they transmit polarizations of light that are parallel to the stretched PVA chains and absorb all others. Film polarizers cannot transmit any light below 400 nm and, even at near-UV wavelengths, absorb a large portion of light, leading to both thermal issues and lower intensities of light available at the printing surface.

Accordingly, a need still exists in the art for a new LCD construction which does not suffer from the above limitations regarding limited wavelengths and limited damage intensity threshold.

SUMMARY

This section provides a general summary of the disclosure, and is not a comprehensive disclosure of its full scope or all of its features.

In one aspect the present disclosure relates to a system for patterning light to at least one of cure an optically curable material or to degrade a portion of optically sensitive material. The system may comprise a liquid crystal display (LCD) screen and a light source for generating unpolarized light. The LCD screen is arranged in a path of transmittance of the unpolarized light. The system may also include first and second wire grid polarizers arranged adjacent to the LCD screen, on opposing sides of the LCD screen and having differing orientations for creating, in connection with operation of the LCD screen, a 2D light mask suitable for initiating the polymerization of an optically curable material. The first wire grid polarizer includes a first plurality of nano-scale wires and the second wire grid polarizer includes a second plurality of nano-scale wires. A pitch of each of the first and second plurality of nano-scale wires is no larger than one-third of the wavelength of the unpolarized light from the light source.

In another aspect the present disclosure relates to a liquid crystal display (LCD) system. The system may comprise a light source for generating unpolarized light, a LCD display, and first and second wire grid polarizer arrays. The first wire grid polarizer array is arranged adjacent to or on a first surface of the LCD display, and has a first plurality wire grid polarizer sections each made up of a first plurality of nano-scale wires orientated in a first configuration, for receiving the unpolarized light and creating polarized light having a first polarization. The LCD display receives the polarized light having the first polarization and selectively rotates first portions of the polarized light to create second portions of light having a second polarization different from the first polarization. The second wire grid polarizer array has a second plurality of wire grid polarizer sections arranged adjacent to or on a second surface of the LCD display opposite to the first surface. The second wire grid polarizer array has a second plurality of nano-scale wires operating to allow only light having one of the first polarization or the second polarization to pass therethrough. The second polarization is orthogonal to the first polarization.

In still another aspect the present disclosure relates to a method of generating a patterned, two-dimensional (2D) light field for curing an optically curable material. The method may comprise using a light source to generate unpolarized light, and using an LCD screen and a plurality of wire grid polarizers each having a plurality of nano-scale wires, to control polarizations of portions of the unpolarized light to create a light mask suitable for initiating the polymerization of an optically curable material. The method may further include configuring a pitch of each of the first and second plurality of nano-scale wires to be no larger than one-third of a wavelength of the unpolarized light from the light source.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings, in which:

(FIG. 5) and 195° C. (FIG. 6), with the wire grid polarizer showing no visual damage at each temperature;

FIG. 8 is a chart showing the measured and calculated transmittance at different wavelengths through a monochrome LCD with parallel wire grid polarizers; and FIG. 9 is a chart that combines the results from the curing and transmittance experiments to determine an optimal operating wavelength that will cure the resin in a short time with as low a starting light intensity as possible. A short cure time is estimated as seven to ten seconds, and the chart uses the intensity required at each wavelength to achieve this cure time combined with the transmittance efficiency of the light patterning components at each wavelength to determine an estimated starting light source intensity.

DETAILED DESCRIPTION

Example embodiments will now be described more fully with reference to the accompanying drawings.

The present disclosure relates to a new LCD construction that incorporates wire grid polarizers. Rather than absorbing the polarization of light not transmitted, wire grid polarizers reflect the blocked polarizations of light, resulting in a significantly higher intensity damage threshold. They are also able to polarize light at lower wavelengths, as the wavelength's lower limit is mainly dependent on the geometry and pitch of the parallel wires used for polarization. Therefore, replacing the two film polarizers on an LCD with two wire grid polarizers allows for the polarization and subsequent 2D patterning of significantly higher intensity light at lower wavelengths, resulting in significantly shorter curing times and the ability to print with a wider range of stereolithography feedstocks.

Wire grid polarizers consist of nano-scale metal wires supported (i.e., either deposited or formed such as by etching) on a substrate material, for example glass. The nano-scale metal wires are arranged in parallel lines with a pitch (i.e., center to center spacing) preferably less than one third of the wavelength of light to be polarized. The nano-scale wires reflect any light that has a component of its electrical field aligned with the wires and transmit the rest of the light which has an electrical field perpendicular to the wires. Therefore, similarly to film polarizers, the use of two wire grid polarizers with their respective nano-scale wires oriented orthogonally to one another (i.e., the nano-scale wires of the first wire grid polarizer all being orthogonal to those of the second wire grid polarizer), will reflect all light and appear to be a mirror.

Since the wavelength of light to be polarized must be greater than the pitch of the metal wires, wire grid polarizers are most commonly used to polarize longer wavelengths of light, such as microwaves and infrared. Additionally, since the degree of polarization is dependent on how parallel the wires are over the entire area of the polarizer, they have heretofore been most commonly used to polarize laser beams, which require relatively small polarizers on the order of one inch.

Figure 1:
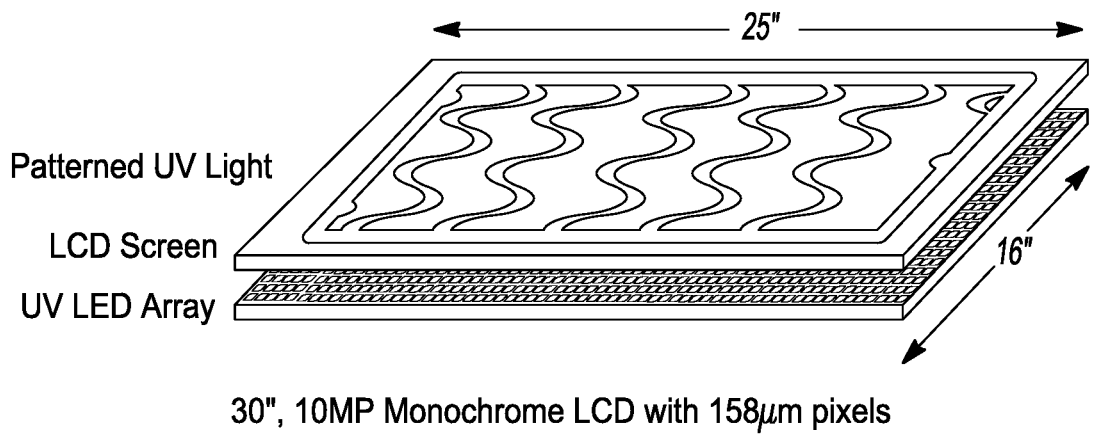
FIG. 1 is a prior art LCD system.
Figure 2:
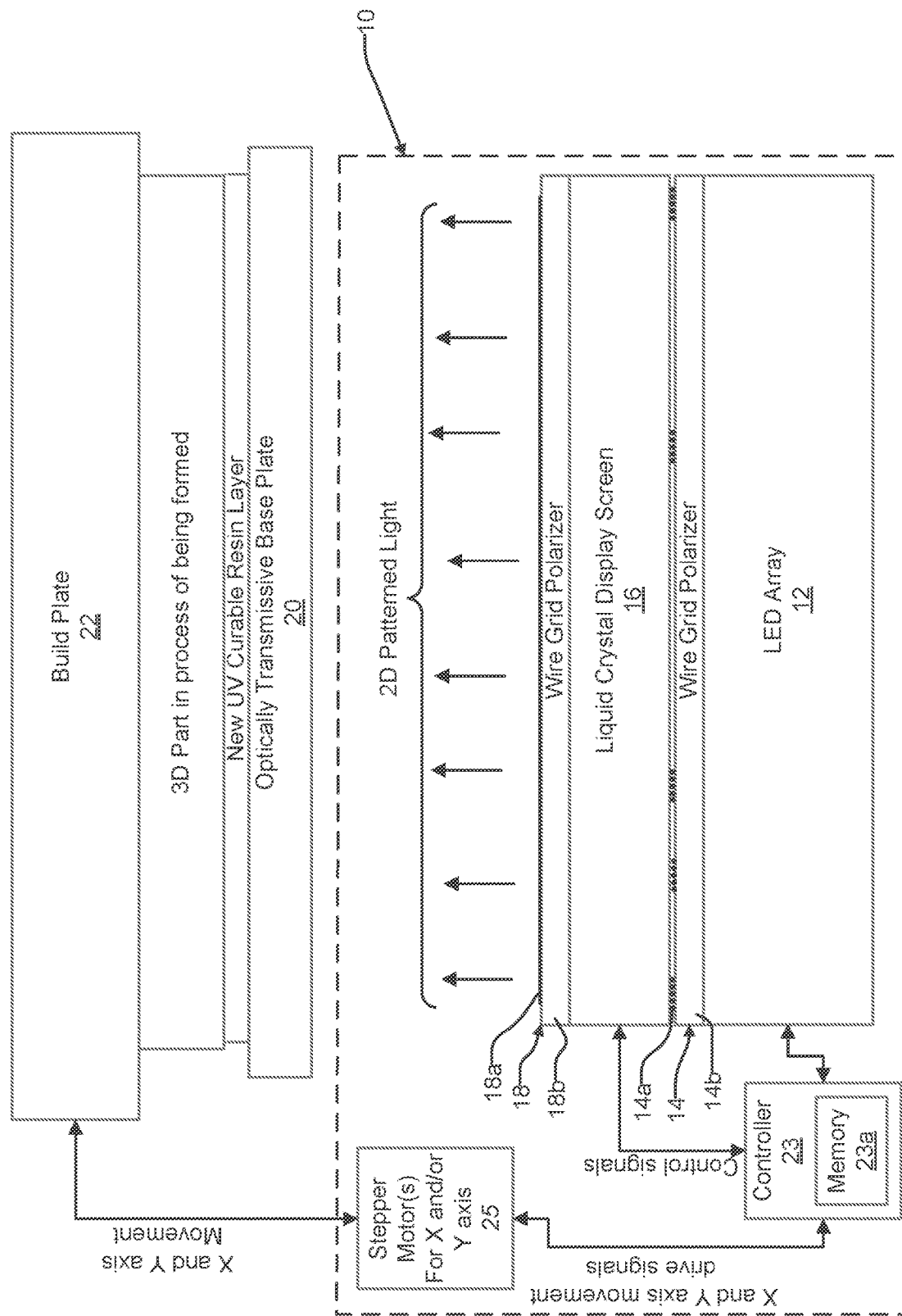
FIG. 2 is a high level side illustration of an LCD system in accordance with one embodiment of the present disclosure (in one embodiment the optically transmissive base plate, the new UV curable resin layer, the 3D part and the build plate do not form part of the present invention)

One embodiment of a liquid crystal display (LCD) system 10 for providing 2D patterned light (i.e., a 2D light mask) in accordance with the present disclosure is shown in FIG. 2. The system 10 in this example comprises an LED array 12, a first wire grid polarizer 14 having a first plurality of parallel arranged nano-scale wires 14a secured to or deposited on a substrate 14b, a LCD screen 16, and a second wire grid polarizer 18 having a second plurality of parallel arranged nano-scale wires 18a secured to or deposited on a substrate 18b. The substrates 14a and 18a may be formed from any suitable optically transmissive material, but glass is one preferred material. Importantly, the nano-scale wires 18a of the second wire grid polarizer 18 are oriented orthogonally to the nano-scale wires 14a of the first wire grid polarizer. As such, the system 10 does not include the traditional pair of film polarizers that a conventional monochrome LCD screen would typically incorporate on its opposing surfaces.

The system 10 of FIG. 2 may also include a controller 23 having a non-volatile memory 23a for storing control software. The controller 23 may generate drive signals for X and Y axis stepper motors 25, or other devices which can control motion of the build plate 22. The controller 23 may also generate control signals for controlling the LCD screen 16, and also the LED array 12. Optionally, one or more separate controllers may be used to control either the stepper motors 24, or the LCD screen 16, or the LED array 12.

Figure 3:
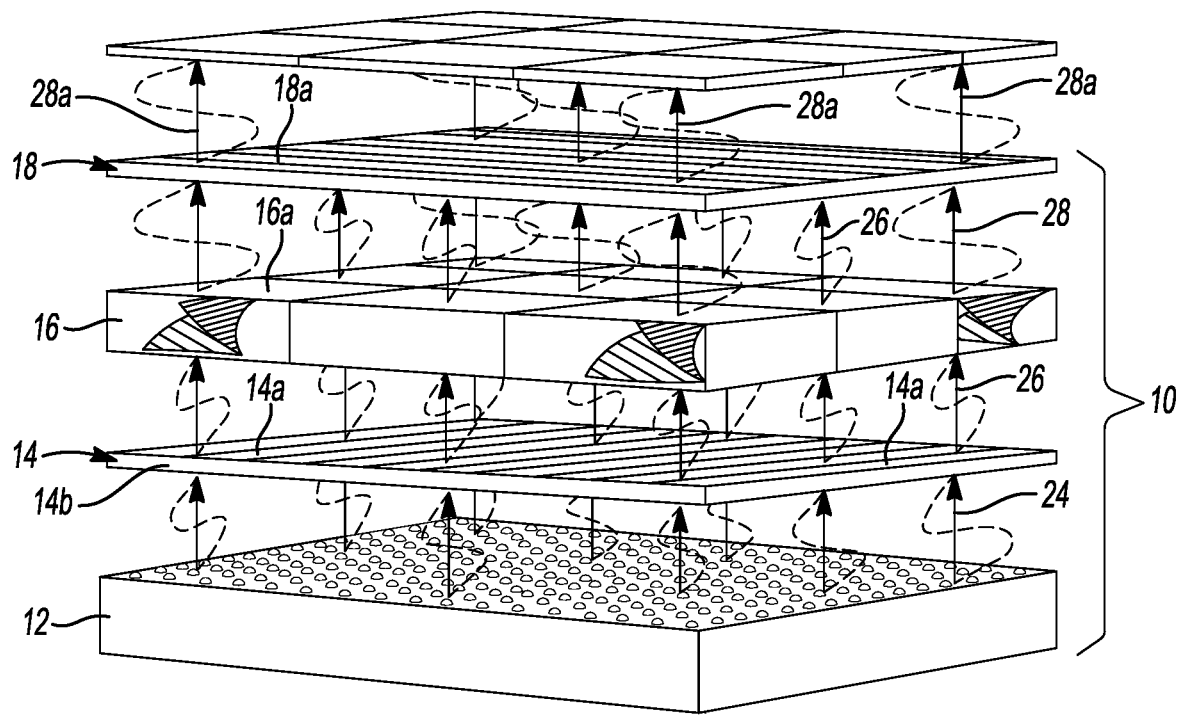
FIG. 3 is an exploded perspective view of the components of the system shown in FIG. 2 along with lines indicating the light rays as they pass through the various components of the system.

With reference to FIG. 3, the LCD system 10 is shown in exploded fashion to better help explain how light is modified as it travels through the LCD system. The first wire grid polarizer 14 is placed in front of the LCD screen 16 to polarize incoming light 24 from the LED array 12 to create polarized light 26. The polarized light 26 enters the LCD screen 16 where it is "patterned" by the LCD screen 16. By "patterned" it is meant that individual, contiguous pixels 16a of the LCD screen 16 are selectively energized by control signals from an external controller (not shown) which selectively rotate the polarization of portions of the polarized light 26 by 90 degrees to create rotated polarized portions of light 28. The orientation of the nano-scale wires 18a of the second wire grid polarizer 18, being perpendicular to the orientation of the nano-scale wires 14a, effectively deflect the un-rotated portions of light (i.e., portions 26), while allowing the rotated polarized portions of light 28 to pass therethrough without modification. By this control, the LCD system 10 creates a patterned 2D light image made up of portions 28a of rotated polarized light which cures select portions of the UV curable resin layer in accordance with the patterned 2D image. The LCD screen 16 and the two wire grid polarizers 14 and 18 thus act to create a "mask" which allows only the light portions 28a having the rotated polarization to pass through to the UV curable resin.

Since the wire grid polarizers 14 and 18 reflect the blocked (i.e., un-rotated polarized) light 26, as opposed to film polarizers, which absorb it, the wire grid polarizers 14 and 18 can polarize much higher intensities of light without overheating. In addition, since the wire grid polarizers are made of glass and metal, rather than plastic, they can dissipate heat more quickly and withstand significantly higher temperatures before failing. In general, wire grid polarizers can reach temperatures up to about 500° C. before failing, whereas the glass transition temperature for polymers used in film polarizers, such as polyvinyl alcohol, is only about 80° C.

Figure 7:
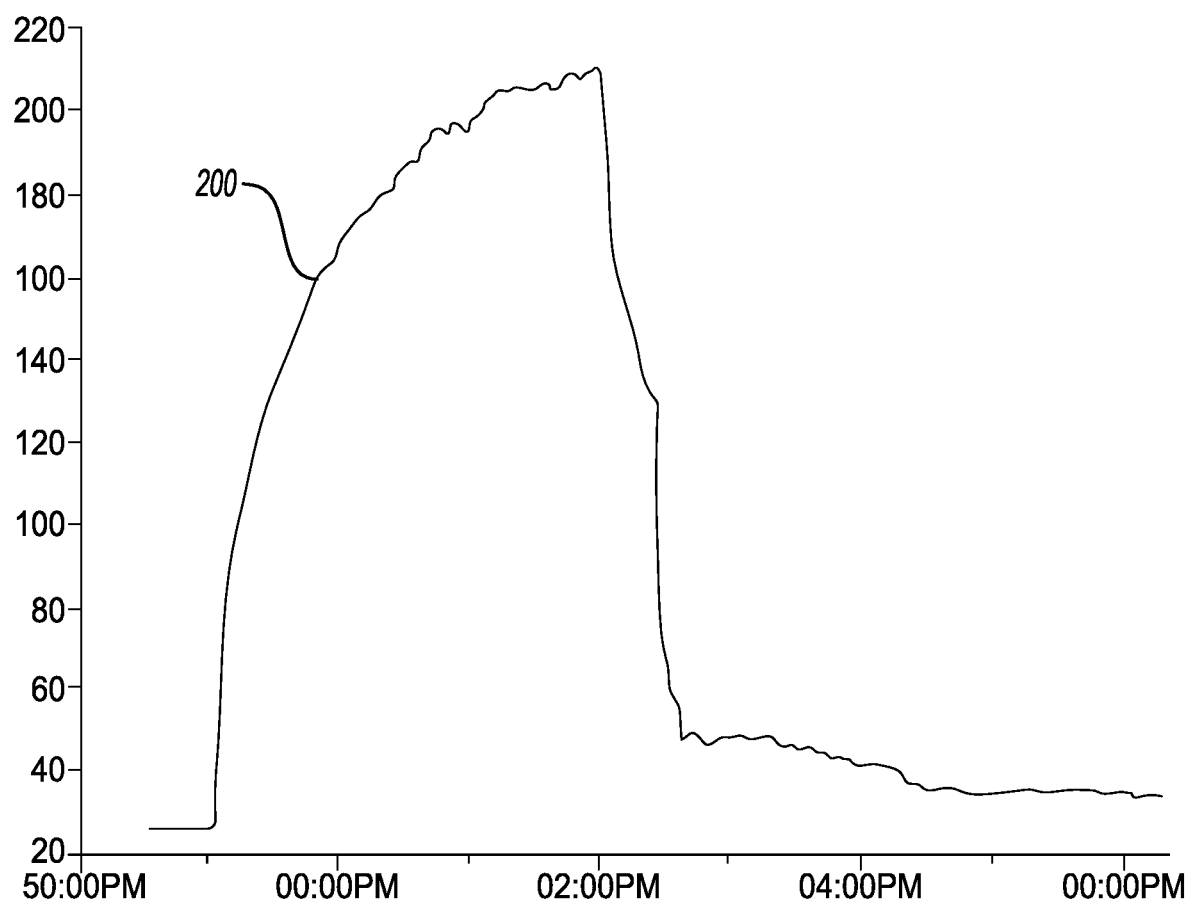
FIG. 7 is a graph showing the temperature vs. time curve for the wire grid polarizers of FIG. 6. Temperature was measured during the illumination process with a k-type surface mount thermocouple on the bottom surface of the polarizer, which is the surface that first interacts with the light. The polarizer was illuminated for 180 s with an intensity of 2000 mW/cm$^2$ of light that had spectral peaks at 405 nm and 450 nm (i.e., 1000 mW/cm$^2$ at 405 nm and 1000 mW/cm$^2$ at 450 nm)

The co-inventors of the LCD system 10 conducted a series of thermal tests on both film and wire grid polarizers to confirm these performances. FIGS. 7 and 8 show the test bed and results for these experiments which both involve placing a surface mount thermocouple on either side of the polarizer while illuminating it with 405 and 450 nm light. The film polarizer yellowed and melted after 5 and 10 seconds under 1000 mW/cm2 of 405 nm light, with yellowing occurring when the film reached 75° C. The wire grid polarizer was illuminated with a combined 1000 mW/cm2 each of 405 and 450 nm light for a total intensity of 2000 mW/cm2. During this test, the polarizer reached a temperature of 210° C. after 180 seconds, at which point the temperature started to reach steady state. After this test, the polarizer had suffered no visible damage and the transmittance rate was unaffected.

Figure 3A:
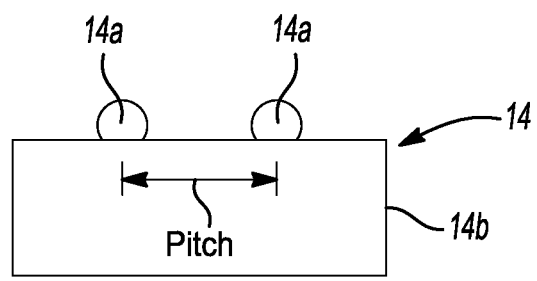
FIG. 3a is a diagram showing a highly enlarged simplified illustration of a pair of nano-scale wires supported on a substrate to help explain the term "pitch" as used in the present disclosure.

With brief reference to FIG. 3a, it will also be appreciated that, the wavelength of light that can be polarized by each of the wire grid polarizers 14 and 18 is mainly dependent on the line width and pitch of the metal wires, and can be significantly lower than that of film polarizers. Wire grid polarizers can polarize light with wavelengths no lower than about three times the pitch of the nano-scale wires 14a and 18a. By "pitch" it is meant the center-to-center spacing of the nano-scale wires 14a, as illustrated in highly enlarged, simplified form in FIG. 3a for the nano-scale wires 14a of the first wire grid polarizer 14. Accordingly, to polarize 360 nm light, a pitch of 120 nm or lower, or a half-pitch of 60 nm, is sufficient.

It will also be understood that while the nano-scale wires 14a are shown as being substantially round in FIG. 3a, that the precise cross-sectional shape of the nano-scale wires may also be rectilinear, and that the precise cross-sectional shape may depend at least in part on the method used to form the nano-scale wires, whether the method involves a material deposition operation, an etching operation, interference lithography, or a different form of manufacture. The cross sectional diameter or dimension of the nano-scale wires is typically on the order of tens of nm to hundreds of nm, and may be varied to suit the needs of a specific application. The nano-scale wires 14a and 18a may be made from various materials such as iridium, tungsten, and silicon, but aluminum is one preferable material for polarizing UVA and near-UV light. In some embodiments the wire grid polarizers 14 and 18 may be identical in construction, and in other embodiments they may differ in construction, such as by different materials used for forming the substrates 14b and 18b or different metals used in forming the nano-scale wires 14a and 18a. In most applications it is expected that the spacing of the nano-scale wires 14a and 18a will be uniform, but this is not absolutely necessary, and the spacing could be varied over the area of a substrate on which the nano-scale wires are supported to meet the needs of a particular application.

Figures 4, 5, 6:
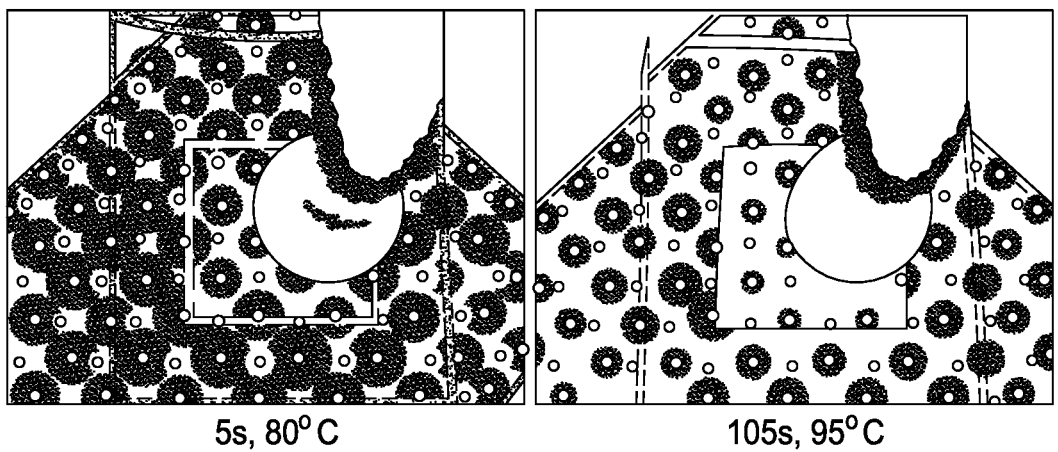
FIG. 4 is a graph comparing transmittance results for light transmittance through one polarizer and two polarizers in parallel, for both a traditional prior art film polarizer and a wire grid polarizer of the present system and method.
FIGS. 5 and 6 illustrate thermal testing results concerning the increased damage resistance by illuminating the wire grid polarizers with an intensity of 2000 mW/cm$^2$ for five seconds and 105 seconds, resulting in temperatures of 80° C.

The co-inventors have conducted transmittance testing on each type of polarizer by taking intensity measurements before the polarizer, after a single polarizer, and after two polarizers oriented parallel to one another, simulating the transmission through active pixels on an LCD screen. FIG. 4 shows the results for these tests at four wavelengths: 365, 385, 405, and 450 nm. Film polarizers did not transmit any light in the UV range. In the visible range, film polarizers transmitted about half the amount of light the wire grid polarizers transmitted. The higher transmission efficiency of the wire grid polarizers 14 and 18 at all wavelengths will enable a lower intensity light source to be used, thus helping to reduce any possible issues concerning thermal management in the LCD system 10. Additionally, the ability of the wire grid polarizers to polarize lower wavelengths of light also allows a lower intensity light source to be used, as photopolymers will be more reactive at lower wavelengths.

Wire grid polarizers at the present time can be fabricated on wafers of up to about 300 mm in diameter. So for additive manufacturing applications requiring a print area larger than this, multiple wafers would need to be tiled together. The Visually Tolerable Tiling method uses a small master stamp that imprints successive wire grid polarizer patterns that slightly overlap each other to create small seams. It has been used to create wire grid polarizers as large as 4"×6" from a ¾"×1" mold with a seam width under 500 nm. Alternatively, the stealth and laser dicing of wafers have defect tolerances on the order of tens to hundreds of microns, so stitching together multiple wafer substrates that were diced will have a seam width in a similar range. Additionally, roll-to-roll fabrication can be used to create wire grid polarizers in a square or rectangular shape with dimensions of up to 300 mm×300 mm.

Figure 3B:
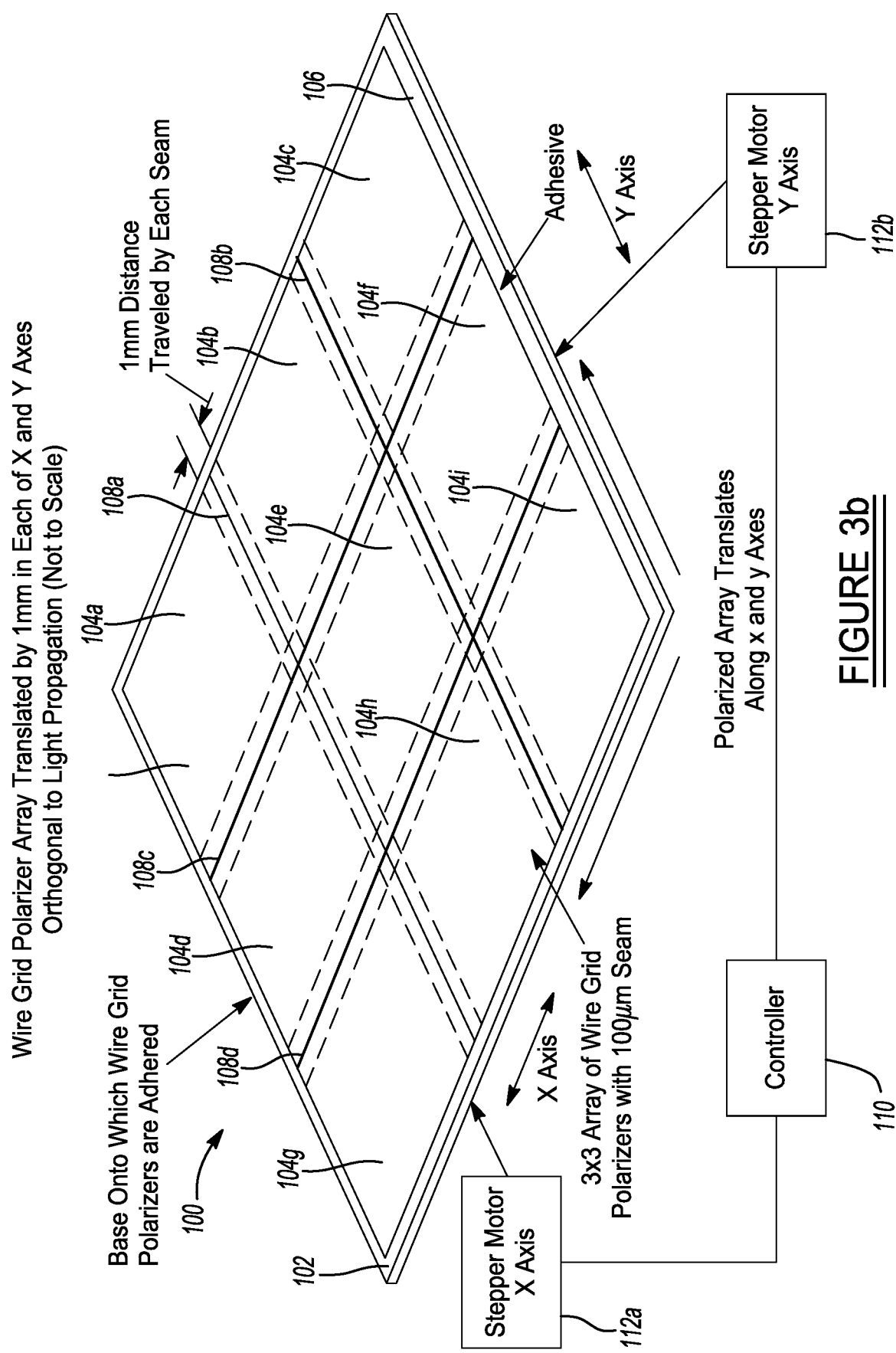
FIG. 3b is a simplified perspective view of a wire grid polarizer array incorporating a plurality of wire grid polarizer sections secured to a single substrate, and further illustrating how the entire array may be shifted back and forth along the X and Y axes to fill in the seams between adjacent polarizer sections with optical energy to meet a predetermined minimum optical power threshold.

When tiling wire grid polarizer wafers together, square or hexagonal wire grid polarizer tiles can be diced from a larger wafer substrate using a dicing saw or laser, and the resulting smaller wafer substrate sections will each have straightness tolerances which range typically from tens to hundreds of microns. Butting and adhering multiple substrates to one another in an array creates seam widths on the same order of magnitude as their straightness tolerance. To account for the light passing through these seams that will not be correctly polarized, the entire array of wire grid polarizers is preferably translated in the x and y axes, or coplanar to the incoming light field and LCD screen. This is illustrated in FIG. 3b. FIG. 3b shows a polarizer array 100 formed by an array of wire grid polarizer sections 104a-104i disposed on a substrate 102. In this example the wire grid polarizer sections 104a-104i are each square shaped and arranged in an X-Y grid, although they need not be square shaped, and they need not necessarily be arranged in an X/Y grid. The two dimensional shape of the polarizer sections 104a-104i will primarily dictate the overall two-dimensional shape of the array formed by the wire grid polarizer sections. The substrate 102 may be formed from any material that is transparent to the light that will be patterned such as borosilicate glass or fused silica. The wire grid polarizer sections 104a-104i in this example are secured to the substrate via a layer of suitable adhesive 106 (e.g., cyanoacrylate or epoxy).

The wire grid polarizer sections 104a-104h shown in FIG. 3b are disposed closely adjacent one another and seam lines 108a-108d, with seam lines 108a and 108b being parallel to one another, and seam lines 108c and 108d being parallel to one another and perpendicular to seam lines 108a and 108b. Because of the seam lines 108a-108d, the polarizer array 100 should be translated in each of the X axis and the Y axis by a minimum distance so that the area covered by each seam 108a-108d during its translation will receive an average amount of polarized light greater than a specified threshold. For example, if the width of each seam 108a-108d is 100 microns, and the critical threshold for average light intensity that needs to be transmitted is 90% of the incoming light, then the seams must travel (i.e., translate) by a distance ten times greater than their width, or at least 1 mm along the X axis and 1 mm along the Y axis (i.e., 0.5 mm left and right along the X axis, and 0.5 mm up and down along the Y axis). This would allow the area of 1 mm where each seam 108a-108d passes over to transmit, on average, polarized light with a flux of 90% of what the polarizer array 100 transmits. This translation of the seams 108a-108d may be accomplished through the use of a controller 110 and suitable motion control devices, which in one example may be separate stepper motors 112a/112b for each of the X and Y axes of movement. Optionally, one single controller may be used to control all components of the system, in which case the controller 23 would also be used to control the stepper motors 112a/112b, if separate polarizer arrays 100 are substituted in place of the wire grid polarizers 14 and 18.

An example of translating the polarizer array 100 of FIG. 3b and a sample calculation to determine how far each seam 108a-108d must be translated are shown in FIG. 2 and in the Equations below:

$$d_{trans} = d_{seam} / \left( \frac{H_{total} - H_{crit}}{H_{total}} \right) \quad (1)$$

$$d_{trans} = 100 \mu m / \left( \frac{2 - 1.8 \left[ \frac{J}{cm^2} \right]}{2 \left[ \frac{J}{cm^2} \right]} \right)$$

$$d_{trans} = 1 mm$$

Therefore, through various manufacturing techniques, wire grid polarizers can be scaled up to accommodate larger print sizes without sacrificing small features, which typically range from 10 to 100 μm in other stereolithography applications and range from the same order of magnitude to considerably larger than the achievable seam thickness.

FIGS. 5 and 6 further illustrate the significantly increased thermal tolerance of the wire grid polarizers 14 and 18 when exposed to light having a total intensity of 2000 mW/cm$^2$ over time periods of 5 seconds and 105 seconds. The figures depict a 1"×1" 70 nm half-pitch wire grid polarizer under illumination from a 3"×3" array of LEDs, half of which have a peak emittance centered around 405 nm and the other half centered around 450 nm. After 180 s of illumination, no visual damage is apparent and the transmittance rate is unaffected.

FIG. 7 shows a temperature versus time curve 200 illustrating the rapid rise in temperature of the wire grid polarizers over a short period of time. This temperature was measured through a surface mount thermocouple on the surface closest to the LED array, and thus will represent the highest temperature experienced by the polarizer. After 180 s, the LED array is turned off, and the polarizer returns to within 20° C. of ambient temperature after 50 s and returns to ambient temperature after 8 minutes.

FIG. 8 shows measured and calculated transmittance through an LCD and a wire grid polarizer, and FIG. 9 shows curing results and a necessary light source to achieve a curing time of 7-10 seconds of the UV curable resin. From these tables it will be noted that 385 nm wavelength light cures more quickly (i.e., 7.5 seconds) at a lower intensity (i.e., 97 mW/cm$^2$ vs. 245 mW/cm$^2$) than 405 nm light does. Even though 385 nm light has a lower transmittance rate through the liquid crystal and the wire grid polarizer, it still cures resin more efficiently, requiring a lower intensity light source by one-half.

While the foregoing embodiments discuss using separate substrates for the wire grid polarizers (or polarizer arrays), which are positioned on opposing sides of the LCD display screen 16, it will be appreciated that the wire grid polarizers 14 and 18 (or the wire grid polarizer array 100) could be created directly on the opposing glass surfaces of the LCD display screen 16. Both implementations are contemplated by the present disclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A system for patterning light to at least one of cure an optically curable material or to degrade a portion of optically sensitive material, the system comprising:
    a liquid crystal display (LCD);
    a light source for generating unpolarized light;
    the LCD screen arranged in a path of transmittance of the unpolarized light;
    first and second wire grid polarizers arranged adjacent to the LCD screen, on opposing sides of the LCD screen and having differing orientations, for creating, in connection with operation of the LCD screen, a 2D light mask suitable for initiating polymerization of an optically curable material;

the first wire grid polarizer includes a first plurality of nano-scale wires;

the second wire grid polarizer includes a second plurality of nano-scale wires;

wherein a pitch of each of the first and second plurality of nano-scale wires is no larger than one-third of a wavelength of the unpolarized light from the light source;

wherein the first wire grid polarizer forms a first polarizer array, and the second wire grid polarizer forms a second polarizer array, and wherein the first and second polarizer arrays each include a plurality of polarizer sections disposed adjacent to one another in a grid-like layout;

wherein the polarizer sections of the first polarizer array are configured such that the first plurality of nano-scale wires of each said polarizer section are all arranged in a first common orientation to enable the first polarizer array to provide a first polarization to the unpolarized light; and wherein the polarizer sections of the second polarizer array are configured such that the second plurality of nano-scale wires of each said polarizer section are arranged in a second common orientation to enable the second polarizer array to provide a second polarization which is orthogonal to the first polarization, to light having passed through the LCD screen.

2. The system of claim 1, wherein:
the first plurality of nano-scale wires is supported on a first substrate disposed adjacent to a first side of the LCD screen; and
the second plurality of nano-scale wires is supported on a second substrate independent of the first substrate, and disposed adjacent to a second side of the LCD screen.

3. The system of claim 1, wherein each of the first and second pluralities of nano-scale wires comprise metal nano-scale wires.

4. The system of claim 3, wherein the metal nano-scale wires are fabricated from at least one of iridium, tungsten, silicon, aluminum, or other appropriate materials.

5. The system of claim 1, wherein:
the first wire grid polarizer comprises a plurality of seams between the polarizer sections thereof; and
the second wire grid polarizer comprises a plurality of seams between the polarizer sections thereof.

6. The system of claim 1, further comprising movement devices for moving the first and second wire grid polarizers about both the X and Y axes by predetermined X and Y axis distances.

7. The system of claim 6, wherein the movement devices comprise stepper motors.

8. The system of claim 7, further comprising a controller for controlling the movement devices.

9. The system of claim 1, further comprising a controller for controlling the LCD display.

10. The system of claim 7, wherein the controller further is configured to control the LCD display.

11. A method of generating a patterned, two-dimensional (2D) light field for curing an optically curable material, the method comprising:
using a light source to generate unpolarized light;
using an LCD screen and first and second wire grid polarizer arrays, having a first and second pluralities of nano-scale wires, respectively, to control polarizations of portions of the unpolarized light to create a light mask suitable for initiating polymerization of an optically curable material;

configuring a pitch of each of the first and second plurality of nano-scale wires to be no larger than one-third a wavelength of the unpolarized light from the light source; and configuring each one of said first and second wire grid polarizer arrays with a plurality of polarizer sections disposed adjacent to one another in a grid-like arrangement, to polarize the unpolarized light from the light source;

further configuring the polarizer sections of the first wire grid polarizer array such that the first plurality of nano-scale wires of each said polarizer section are all arranged in a first common orientation to enable the first wire grid polarizer array to provide a first polarization to the unpolarized light; and further configuring the polarizer sections of the second wire grid polarizer array such that the second plurality of nano-scale wires of each said polarizer section are arranged in a second common orientation to enable the second wire grid polarizer array to provide a second polarization which is orthogonal to the first polarization, to light having passed through the LCD screen.

12. A liquid crystal display (LCD) system, comprising:
a light source for generating unpolarized light;
a LCD display;
a first wire grid polarizer array arranged adjacent to or on a first surface of the LCD display, and having a first plurality of wire grid polarizer sections each made up of a first plurality of nano-scale wires orientated in a first configuration, for receiving the unpolarized light and creating polarized light having a first polarization;
the LCD display receiving the polarized light having the first polarization and selectively rotating first portions of the polarized light to create second portions of light having a second polarization different from the first polarization;
a second wire grid polarizer array having a second plurality of wire grid polarizer sections arranged adjacent to or on a second surface of the LCD display opposite to the first surface, the second wire grid polarizer array having a second plurality of nano-scale wires operating to allow only light having one of the first polarization or the second polarization to pass therethrough; and wherein the second polarization is orthogonal to the first polarization;
the first plurality of wire grid polarizer sections disposed adjacent to one another to form first seams between the wire grid polarizer sections; and
the second plurality of wire grid polarizer sections disposed adjacent to one another to form second seams between the wire grid polarizer sections; and
movement devices for moving the first and second wire grid polarizer arrays about both X and Y axes by predetermined X and Y axis distances in relation to the first and second seams.

13. The system of claim 12, wherein the nano-scale wires of each one of the first and second pluralities of nano-scale wires have a pitch selected to be no larger than one third of a wavelength of the unpolarized light generated by the light source.

14. The system of claim 12, wherein:
the first wire grid polarizer array includes a first substrate on which the first plurality of nano-scale wires of each one of the first plurality of wire grid polarizer sections is supported; and
the second wire grid polarizer array includes a second substrate on which the second plurality of nano-scale wires of each one of the second plurality of wire grid polarizer sections is supported.

15. The system of claim 12, wherein the first wire grid polarizer array includes a first substrate, and the second wire grid polarizer array includes a second substrate, and wherein at least one of the first and second substrates comprises at least one of PET, fused silica, or glass.

16. The system of claim 12, wherein the nano-scale wires of each one of the first and second pluralities of nano-scale wires comprise wires of at least one of iridium, tungsten, silicon, or aluminum in nanostructure patterns.

17. The system of claim 12, wherein the first wire grid polarizer array includes a first substrate and the second wire grid polarizer array includes a second substrate, and wherein the substrate of the second wire grid polarizer array comprises at least one of PET, fused silica, or glass.

18. The system of claim 12, wherein the light source comprises an LED array.

19. The system of claim 12, wherein the first and second wire grid polarizer arrays are of identical construction.

20. The system of claim 12, wherein the first and second wire grid polarizer arrays are of different construction.

* * * * *